United States Patent
Fuss

(10) Patent No.: US 11,851,762 B2
(45) Date of Patent: Dec. 26, 2023

(54) COATING DEVICE HAVING COATED TRANSMITTER COIL

(71) Applicant: AIXTRON SE, Herzogenrath (DE)

(72) Inventor: Hans-Gerd Fuss, Herzogenrath (DE)

(73) Assignee: AIXTRON SE, Herzogenrath (DE)

( * ) Notice: Subject to any disclaimer, the term of this patent is extended or adjusted under 35 U.S.C. 154(b) by 671 days.

(21) Appl. No.: 16/628,985

(22) PCT Filed: Jul. 3, 2018

(86) PCT No.: PCT/EP2018/067947
§ 371 (c)(1),
(2) Date: Jan. 6, 2020

(87) PCT Pub. No.: WO2019/007956
PCT Pub. Date: Jan. 10, 2019

(65) Prior Publication Data
US 2020/0123657 A1  Apr. 23, 2020

(30) Foreign Application Priority Data

Jul. 7, 2017  (DE) .................. 20 2017 104 061.5

(51) Int. Cl.
*C23C 16/46*  (2006.01)
*H05B 6/10*  (2006.01)
(Continued)

(52) U.S. Cl.
CPC .......... *C23C 16/46* (2013.01); *C23C 16/4586* (2013.01); *H01J 37/32715* (2013.01);
(Continued)

(58) Field of Classification Search
CPC ..... C23C 16/46; C23C 16/4586; H05B 6/105; H01J 37/32715; C25D 7/001; C25D 7/0607
See application file for complete search history.

(56) References Cited

U.S. PATENT DOCUMENTS 4,699,675 A  10/1987  Ongeway
7,241,506 B2  7/2007  Hartig
(Continued)

FOREIGN PATENT DOCUMENTS

DE  10 2009 025 971 A1  12/2010
DE  10 2010 016 471 A1  10/2011
WO     2001/078105 A1  10/2001

OTHER PUBLICATIONS

Nguyen, Minh Quoc, et al., "Field Distribution Models of Spiral Coil for Misalignment Analysis in Wireless Power Transfer Systems". IEEE Transactions on Microwave Theory and Techniques, vol. 62, No. 4, Apr. 2014, pp. 920-930.*
(Continued)

*Primary Examiner* — Brian W Jennison
(74) *Attorney, Agent, or Firm* — ASCENDA LAW GROUP, PC

(57) ABSTRACT

A device, for depositing a layer on a substrate by supplying one or more process gases to a process chamber, includes a susceptor and one or more transmitter coils. The susceptor bearing the substrate can be heated to a process temperature by means of an electromagnetic alternating field generated by the one or more transmitter coils. The one or more transmitter coils have a coating that consists of tin and nickel in order to provide a corrosion-resistant coating, which simultaneously has low emissivity and is therefore effective in the presence of chlorine compounds and moisture.

13 Claims, 1 Drawing Sheet

(51) Int. Cl.
*C23C 16/458* (2006.01)
*H01J 37/32* (2006.01)
*C25D 7/00* (2006.01)
*C25D 7/06* (2006.01)

(52) U.S. Cl.
CPC ............. *H05B 6/105* (2013.01); *C25D 7/001* (2013.01); *C25D 7/0607* (2013.01)

(56) References Cited

U.S. PATENT DOCUMENTS

| | | | |
|---|---|---|---|
| 7,897,205 B2 | 3/2011 | Kameshima et al. | |
| 2010/0271161 A1 | 10/2010 | Yan et al. | |
| 2011/0037557 A1* | 2/2011 | Konoue | H01F 27/34 336/200 |
| 2011/0259879 A1* | 10/2011 | Hanawa | C23C 16/4584 118/725 |
| 2012/0052216 A1 | 3/2012 | Hanawa et al. | |
| 2012/0148760 A1* | 6/2012 | Egami | H01L 21/67109 427/559 |
| 2016/0333479 A1* | 11/2016 | Boyd | C23C 16/46 |

OTHER PUBLICATIONS

International Preliminary Report on Patentability dated Jan. 7, 2020, from The International Bureau of WIPO, for International Patent Application No. PCT/EP2018/067947 (filed Jul. 3, 2018), 15 pages.
Written Opinion dated Sep. 28, 2018, from the ISA/European Patent Office, for International Patent Application No. PCT/EP2018/067947 (filed Jul. 3, 2018), English translation, 6 pages.
International Search Report dated Sep. 28, 2018, from the ISA/European Patent Office, for International Patent Application No. PCT/EP2018/067947 (filed Jul. 3, 2018), 5 pages.
Written Opinion dated Sep. 28, 2018, from the ISA/European Patent Office, for International Patent Application No. PCT/EP2018/067947 (filed Jul. 3, 2018), 7 pages.

* cited by examiner

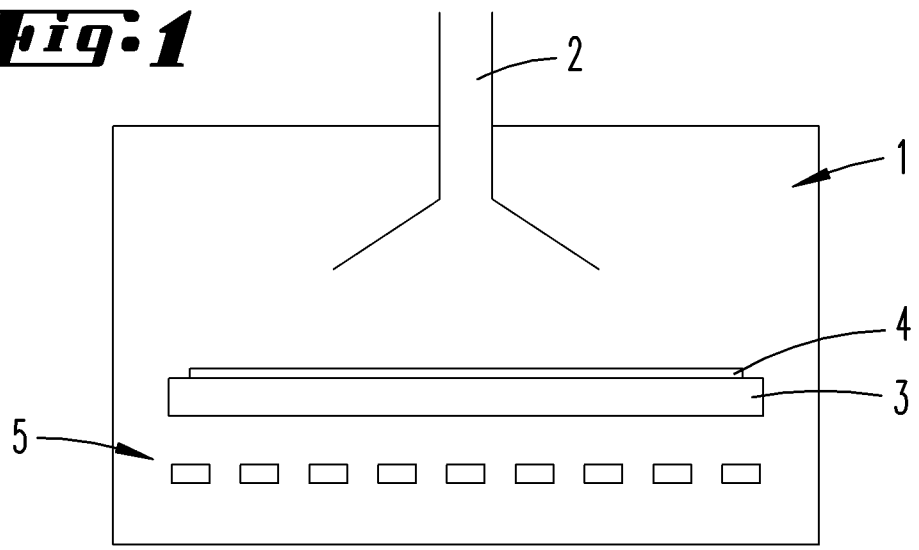
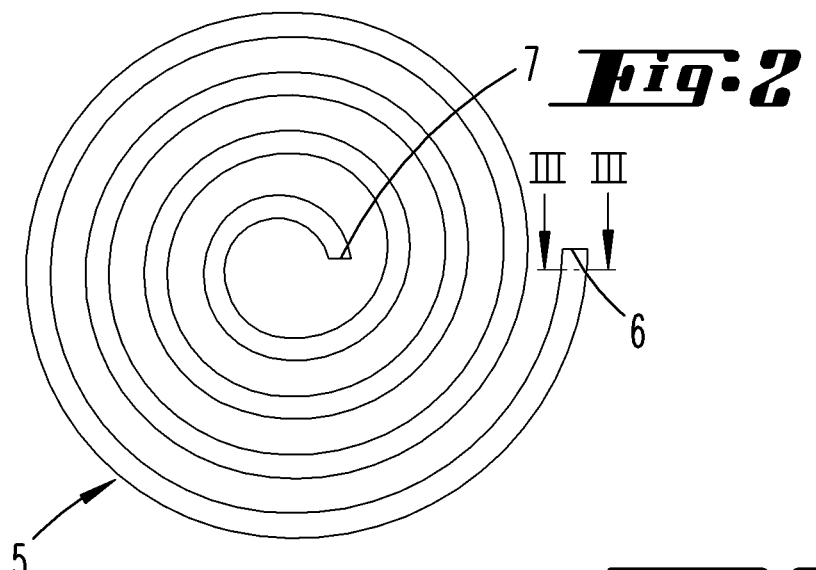
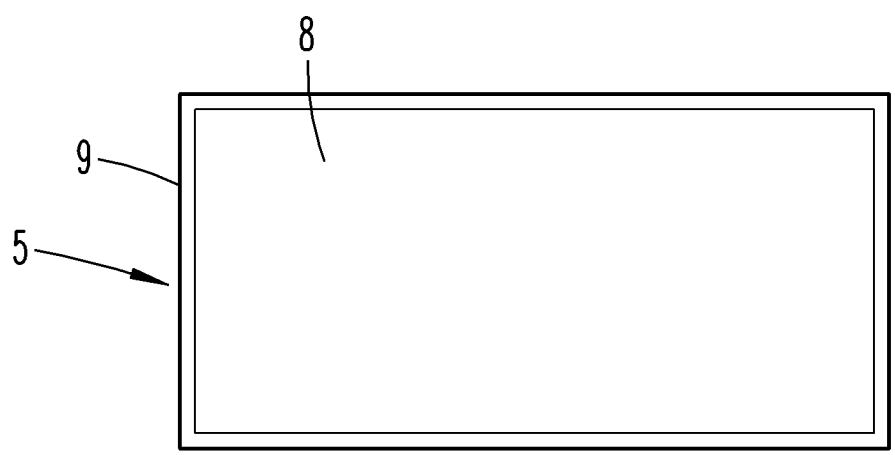

COATING DEVICE HAVING COATED TRANSMITTER COIL

RELATED APPLICATIONS

This application is a National Stage under 35 USC 371 of and claims priority to International Application No. PCT/EP2018/067947, filed 3 Jul. 2018, which claims the priority benefit of DE Application No. 20 2017 104 061.5, filed 7 Jul. 2017.

FIELD OF THE INVENTION

The invention relates to a device for depositing a layer on a substrate by supplying one or a plurality of process gases into a process chamber, in which a susceptor bearing the substrate can be heated to a process temperature by means of an electromagnetic alternating field generated by one or a plurality of transmitter coils, wherein the one or a plurality of transmitter coils have a coating.

BACKGROUND

A device of this type is described in DE 10 2010 016 471 A1. A process chamber, in which a susceptor consisting of an electrically conductive material, on which a substrate rests, is located in a housing, which is sealed in a gas-tight manner relative to the environment. Reactive process gases are supplied to the process chamber by means of a gas inlet device. The susceptor is heated by a heating device to a process temperature at which the process gases decompose pyrolytically so as to deposit a layer on the substrate. The heating of the susceptor takes place by means of an electromagnetic alternating field with radio frequency. Eddy currents induced in the susceptor generate heat, which heats the substrate.

The transmitter coils, with which the electromagnetic alternating field is generated, are provided with a gold layer. Gold, like other precious metals, has the property of a low optical emissivity that does not change over time.

A low optical emissivity is advantageous because the heat losses via the transmitter coil can thereby be minimized. A changing emissivity, e.g. due to oxide layers or reaction layers, would adversely affect the heat balance of the reactor. Although the physical and chemical properties of gold are sufficient for such applications, there is an aspiration to use coatings that are corrosion resistant to moisture and $Cl_2$ (or HCl), and which moreover have a low emissivity that is constant over time. The prior art also includes DE 10 2009 025 971, U.S. Pat. Nos. 7,897,205, 4,699,675, US 2012/052216, U.S. Pat. No. 7,241,506 and US 2011/259879.

SUMMARY OF THE INVENTION

The object underlying the invention is the specification of a transmitter coil coating for a generic device that is resistant to corrosion, and at the same time has low emissivity and is therefore effective in the presence of chlorine compounds and moisture.

The object is achieved by the invention specified in the claims, wherein the subsidiary claims represent not only advantageous developments of the main claim, but also independent achievements of the object. Individual features of the claims can be combined with individual features of other claims.

An improved device and an improved transmitter coil are specified in accordance with the invention.

First and foremost, it is envisaged that a coating of tin and nickel will be used instead of a coating consisting of precious metals. The outermost layer of the coating preferably possesses only the elements of tin and nickel. The transmitter coil, which consists in particular of a non-ferrous metal and is designed as a spiral-shaped hollow body, possesses an outer surface that is mechanically cleaned in a suitable manner prior to coating, e.g. by blasting with glass beads. The inventive coating is applied onto a base layer (1-50 μm chemical NiP (Hi-phosphorus (10-14% by weight)). The coating is a mixture of two nickel/tin compounds, namely a mixture of $Ni_3Sn_2$ and $Ni_3 Sn_4$. The mixture can have a non-stochiometric composition. In particular, it is envisaged that the coating has a tin/nickel ratio of between 60/40% by weight and 70/30% by weight. The Sn/Ni ratio is particularly preferably 65/35% by weight. The layer thickness can lie in the range between 1 and 50 μm, and 1 and 30 μm. Preferably it is approximately 20 μm. The deposition of the layer on the base body, which may be pre-treated, of the transmitter antenna takes place galvanically. However, other coating options, such as sputtering or dip coating, are also conceivable. The nickel-containing base layer, which preferably has a layer thickness of at least 30 μm, forms a diffusion barrier.

The inventive coating has proved to be resistant to chlorine and chlorine-containing compounds on the one hand, and on the other hand has a low optical emissivity, that is to say, a high optical reflectivity. Moreover, the emissivity/reflectivity is stable over time. It does not change even after prolonged exposure of the coating to chlorine or a chlorine-containing compound, even at higher temperatures. The layer is highly resistant to chlorine ions and forms an effective diffusion barrier against chlorine ions. It prevents chlorine ions from diffusing through the coating to the base material of the metallic transmitter coil. Unlike, for example, nickel or chromium, the inventive mixture/alloy has an essentially constant emissivity. The optical properties of the surface do not change even if the surface is exposed to chlorine or chlorine-containing compounds over a longer period of time. Chemical resistance is ensured, especially in a chlorine-rich and humid environment.

BRIEF DESCRIPTION OF THE DRAWINGS

In what follows the invention is explained with the aid of accompanying figures. Here:

FIG. 1 shows schematically the cross-section of a coating device,

FIG. 2 shows the plan view onto a transmitter coil 5, and

FIG. 3 shows the cross-section of a transmitter coil 5 along line III-III of FIG. 2.

DETAILED DESCRIPTION

A gas-tight housing surrounds a process chamber 1, into which a gas inlet device 2 opens, through which (besides other precursors) chlorine-containing gases, for example chlorine-containing compounds of elements of the III-main group, are also supplied. However, other chlorine-containing compounds can also be supplied through the gas inlet device 2, for example so as to clean the process chamber 1 after a coating process by means of an etching step. Here $Cl_2$ or HCl in particular can be considered as the gases.

In the process chamber 1 there is a susceptor 3, which consists of graphite or another electrically conductive material, and which bears one or a plurality of substrates 4, which are to be coated. In particular, they can be coated with a semiconductor layer, and in particular with a III-V semiconductor layer.

Underneath and in the same process chamber 1 a transmitter coil 5 is located, which is made of metal and has a spiral shape. The transmitter coil 5 has two ends 6, 7, which are connected in an electrically conductive manner to supply lines arranged outside the process chamber 1 (see WO 01/78105). A coolant can also be supplied through these supply lines, which flows through a cavity 8 of the transmitter coil 5, which cavity has a rectangular or a round cross-section.

The transmitter coil 5, which is made of metal, in particular a Cu-alloy, has an outwardly facing surface that can come into contact with the process gas supplied to the process chamber 1, and in particular with chlorine-containing gases. To prevent chlorine ions from corrosively attacking the metal of the transmitter coil body, the transmitter coil 5 has a coating on its outer surface. The coating 9, which in the prior art consists of a precious metal and in particular gold, in accordance with the invention is formed by a tin-nickel alloy, wherein the tin/nickel ratio is 65/35% by weight, and the layer thickness is 20 µm. The coating is applied galvanically.

Before the coating of the transmitter coil 5, it can be pre-treated in a suitable manner; for example, it can be mechanically cleaned by blasting with glass beads. Chemical pre-treatment can take place, for example by depositing a base layer (NiP, NiCo, bronze). The base layer can be 50 µm thick. The tin-nickel coating can consist of two phases: $Ni_3Sn_2$ and $Ni_3Sn_4$. It therefore takes the form of a metastable phase mixture of two phases.

The coating of the transmitter coil 5 is preferably a multi-layer coating. The transmitter coil 5 preferably consists of copper, or essentially of copper. A layer containing essentially nickel is firstly deposited on the surface of the copper base body. This base layer is preferably a chemical nickel layer. The base layer serves as an additional diffusion barrier and preferably has a layer thickness of at least 30 µm. The layer thickness can lie in the range between 30 µm and 50 µm. On this base layer is deposited the layer consisting of tin and nickel, the thickness of which can lie between 1 and 50 µm. It preferably lies in the range between 10 and 20 µm. The tin/nickel ratio lies within the range specified above.

The above statements serve to explain the inventions recorded by the application as a whole, which develop the prior art at least by means of the following combinations of features, and in each case also independently, wherein two, a plurality, or all, of these combinations of features can also be combined, namely:

A device, which is characterized in that the coating 9 consists of tin and nickel.

A device, which is characterized in that the coating 9 is a mixture of $Ni_3 Sn_2$ and $Ni_3 Sn_4$.

A device, which is characterized in that the coating 9 has a nickel content of between 40 and 30% by weight and a tin content of between 60 and 70% by weight.

A device, which is characterized in that an outermost layer of the coating 9 consists exclusively of the elements nickel and tin.

A device, which is characterized in that the tin/nickel ratio of the coating 9 is 65/35% by weight.

A device, which is characterized in that the thickness of the coating 9 is between 1 and 50 µm, or between 1 and 30 µm, and is preferably 20 µm.

A device, which is characterized in that the coating 9 is galvanically deposited onto the transmitter coil 5.

A device, which is characterized in that a base layer, which essentially contains nickel and bears the coating 9, is applied onto the transmitter coil, which essentially contains copper.

A device, which is characterized in that the base layer has a thickness of 1 to 50 µm, and in particular of at least 30 µm.

A transmitter coil, which is characterized in that the coating consists of tin and nickel.

A transmitter coil, which is characterized in that the coating 9 is a mixture of $Ni_3 Sn_2$ and $Ni_3 Sn_4$.

A transmitter coil, which is characterized in that the tin/nickel ratio lies in the range between 60/40% by weight and 70/30% by weight, and in particular is 65/35% by weight, and/or in that the layer thickness is in the range between 1 and 50 µm, and in particular is 20 µm.

All disclosed features are essential to the invention (both individually, and also in combination with one another). In the disclosure of the application, the disclosure content of the associated/attached convention documents (transcript of the prior application) is hereby also incorporated in full, also for the purpose of incorporating features of these documents in the claims of the present application. The subsidiary claims characterise, even without the features of a claimed claim, with their features independent inventive developments of the prior art, in particular in order to make divisional applications on the basis of these claims. The invention specified in each claim can additionally comprise one or a plurality of the features described in the above description, in particular with features provided with reference symbols and/or specified in the list of reference symbols. The invention also relates to forms in which individual of the features mentioned in the above description are not implemented, in particular insofar as they are recognizably dispensable for the respective purpose, or can be replaced by other technically equivalent means.

LIST OF REFERENCE SYMBOLS

1 Process chamber
2 Gas inlet device
3 Susceptor
4 Substrate
5 Transmitter coil
6 End
7 End
8 Cavity
9 Coating

What is claimed is:
1. A device for depositing a layer onto a substrate (4), the device comprising:
   a process chamber (1), wherein one or more process gases are supplied into the process chamber (1);
   susceptor (3) for bearing the substrate (4); and
   one or more transmitter coils (5),
   wherein the susceptor (3) is heated to a process temperature by means of an electromagnetic alternating field generated by the one or more transmitter coils (5),
   wherein a coating (9) that includes tin and nickel is present on the one or more transmitter coils (5),
   wherein each of the one or more transmitter coils (5) comprises a cavity (8) configured to carry a coolant within the one or more transmitter coils (5), and
   wherein the one or more transmitter coils have an outwardly facing surface formed by the coating (9) that comes into contact with the one or more process gases supplied into the process chamber (1).

2. The device of claim 1, wherein the coating (9) is a mixture of $Ni_3 Sn_2$ and $Ni_3 Sn_4$.

3. The device of claim 1, wherein the coating (9) has a nickel content of between 40 and 30% by weight, and a tin content of between 60 and 70% by weight.

4. The device of claim 1, wherein an outermost layer of the coating (9) consists exclusively of nickel and tin.

5. The device of claim 1, wherein a tin/nickel ratio of the coating (9) is 65/35% by weight.

6. The device of claim 1, wherein a thickness of the coating (9) is between 1 and 50 μm.

7. The device of claim 1, wherein the coating (9) is galvanically deposited onto the one or more transmitter coils (5).

8. The device of claim 1, wherein the one or more transmitter coils (5) contains copper, the device further comprising a base layer that is applied onto the one or more transmitter coils (5), wherein the base layer contains essentially nickel and bears the coating (9) that includes tin and nickel.

9. The device of claim 8, wherein the base layer has a thickness of 1 to 50 μm or at least 30 μm.

10. A method, comprising:
heating a susceptor (3) that bears a substrate (4), the susceptor heated by an electromagnetic alternating field generated by a spiral-shaped transmitter coil (5), wherein the spiral-shaped transmitter coil (5) has a cavity (8) extending between two ends (6, 7) of the spiral-shaped transmitter coil (5), and wherein the spiral-shaped transmitter coil (5) has an outer wall surrounding the cavity (8), the outer wall coated with a coating (9) that includes nickel and tin;
flowing a coolant through the cavity (8) of the spiral-shaped transmitter coil (5); and
depositing a layer onto the substrate (4) by supplying one or more process gases into a process chamber (1) that contains the susceptor (3) and the substrate (4), wherein the spiral-shaped transmitter coil (5) has an outwardly facing surface formed by the coating (9) that comes into contact with the one or more process gases supplied into the process chamber (1).

11. The method of claim 10, wherein the coating (9) consists of a mixture of $Ni_3 Sn_2$ and $Ni_3 Sn_4$.

12. The method of claim 10, wherein a tin/nickel ratio of the coating (9) lies a range of between 60/40% by weight and 70/30% by weight, and/or a thickness of the coating (9) lies in a range between 1 and 50 μm.

13. The device of claim 1, wherein the one or more transmitter coils (5) and the susceptor (3) are contained within the process chamber (1).

\* \* \* \* \*